United States Patent
Savithri et al.

(10) Patent No.: US 9,915,696 B1
(45) Date of Patent: Mar. 13, 2018

(54) AREA-EFFICIENT PERFORMANCE MONITORS FOR ADAPTIVE VOLTAGE SCALING

(71) Applicant: Xilinx, Inc., San Jose, CA (US)

(72) Inventors: Nagaraj Savithri, Plano, TX (US); Fu-Hing Ho, Los Gatos, CA (US)

(73) Assignee: XILINX, INC., San Jose, CA (US)

( * ) Notice: Subject to any disclaimer, the term of this patent is extended or adjusted under 35 U.S.C. 154(b) by 239 days.

(21) Appl. No.: 14/792,189

(22) Filed: Jul. 6, 2015

(51) Int. Cl.
*G06F 19/00* (2011.01)
*G01R 31/36* (2006.01)
*G01R 31/317* (2006.01)
*G01R 31/28* (2006.01)
*G01R 31/3183* (2006.01)

(52) U.S. Cl.
CPC . *G01R 31/2824* (2013.01); *G01R 31/318307* (2013.01)

(58) Field of Classification Search
CPC .......... H01L 2224/131; G01R 31/2824; G01R 31/2834; G01R 31/31725; G01R 31/318594; G06F 2217/84
USPC ................... 327/265, 279, 293, 299; 331/57
See application file for complete search history.

(56) References Cited

U.S. PATENT DOCUMENTS

| | | | |
|---|---|---|---|
| 6,817,006 B1 * | 11/2004 | Wells ............. | G01B 31/318519 716/112 |
| 2008/0224742 A1 * | 9/2008 | Pomichter ................. | G06F 7/68 327/119 |
| 2013/0019324 A1 * | 1/2013 | Tehranipoor ......... | H03K 3/0315 726/34 |
| 2014/0354341 A1 * | 12/2014 | Carmon ............. | G01R 31/2851 327/299 |

* cited by examiner

*Primary Examiner* — Jonathan Han
(74) *Attorney, Agent, or Firm* — Robert M. Brush

(57) ABSTRACT

Techniques for adaptively scaling power supply voltage of a programmable integrated circuit. Compact speed-testing ring oscillators are inserted into a pre-constructed circuit model to test the speed of speed-critical aspects of the interconnect fabric of the programmable integrated circuit. The speed-testing ring oscillators are compact due to including only two elements configured from lookup table elements ("LUTs") of the programmable integrated circuit. The speed-testing ring oscillators are connected to a power management unit which receives speed values output from the speed-testing ring oscillators and adjusts the power supply voltage to maintain the speed-testing ring oscillators operating at or above a prescribed speed. If all speed-testing ring oscillators are operating too fast, then power management unit reduces voltage to reduce the total power consumed by the programmable integrated circuit while still maintaining operation above a desired speed.

20 Claims, 6 Drawing Sheets

AREA-EFFICIENT PERFORMANCE MONITORS FOR ADAPTIVE VOLTAGE SCALING

TECHNICAL FIELD

Examples of the present disclosure generally relate to programmable integrated circuits and, in particular, to area-efficient performance monitors for adaptive voltage scaling.

BACKGROUND

Programmable integrated circuits such as field programmable gate arrays offer a large amount of flexibility in that a single device may be configured to implement a wide array of different circuits. In operation, a power supply voltage that provides power to a programmable integrated circuit affects both the amount of electrical power consumed as well as the speed of operation of the programmable integrated circuit. Thus, in order to minimize power consumption, it is advantageous to determine the lowest power supply voltage that can support a desired speed at which the programmable integrated circuit can operate. Techniques for controlling the power supply voltage in this manner are thus needed.

SUMMARY

A speed-testing ring oscillator for testing speed of a programmable integrated circuit is provided. The speed-testing ring oscillator includes an AND gate configured from a first configurable logic element of the programmable integrated circuit. The speed-testing ring oscillator also includes a first speed-testing sequence coupled to an output of the AND gate. The speed-testing ring oscillator further includes a buffer coupled to an output of the first speed-testing sequence. The speed-testing ring oscillator also includes a second speed-testing sequence coupled to an output of the buffer and to an inverting input of the AND gate. The first speed-testing sequence includes a first programmable interconnect point and a first interconnect and the second speed-testing sequence includes a second programmable interconnect point and a second interconnect.

A programmable integrated circuit is also provided. The programmable integrated circuit includes a first speed-testing ring oscillator and a power management unit coupled to the first speed-testing ring oscillator. The first speed-testing ring oscillator includes an AND gate configured from a first configurable logic element of the programmable integrated circuit. The first speed-testing ring oscillator also includes a first speed-testing sequence coupled to an output of the AND gate. The first speed-testing ring oscillator further includes a buffer coupled to an output of the first speed-testing sequence. The first speed-testing ring oscillator also includes a second speed-testing sequence coupled to an output of the buffer and to an inverting input of the AND gate, wherein the first speed-testing sequence includes a first programmable interconnect point and a first interconnect and the second speed-testing sequence includes a second programmable interconnect point and a second interconnect. The power management unit is operable to adjust a power supply voltage for the programmable integrated circuit based on an output of the first speed-testing ring oscillator.

A method for configuring a programmable integrated circuit for adaptive voltage scaling is also provided. The method includes obtaining a circuit model for analysis. The method also includes identifying free space within the circuit model for a speed-testing ring oscillator. The method further includes adding the speed-testing ring oscillator to the free space of the circuit model. The method also includes configuring the programmable integrated circuit with the speed-testing ring oscillator. The speed-testing ring oscillator includes an AND gate configured from a first configurable logic element of the programmable integrated circuit. The speed-testing ring oscillator also includes a first speed-testing sequence coupled to an output of the AND gate. The speed-testing ring oscillator further includes a buffer coupled to an output of the first speed-testing sequence. The speed-testing ring oscillator also includes a second speed-testing sequence coupled to an output of the buffer and to an inverting input of the AND gate. The first speed-testing sequence includes a first programmable interconnect point and a first interconnect and the second speed-testing sequence includes a second programmable interconnect point and a second interconnect.

BRIEF DESCRIPTION OF THE DRAWINGS

So that the manner in which the above recited features can be understood in detail, a more particular description, briefly summarized above, may be had by reference to example implementations, some of which are illustrated in the appended drawings. It is to be noted, however, that the appended drawings illustrate only typical example implementations and are therefore not to be considered limiting in scope.

To facilitate understanding, identical reference numerals have been used, where possible, to designate identical elements that are common to the figures. It is contemplated that elements of one example may be beneficially incorporated in other examples.

DETAILED DESCRIPTION

Figure 1:
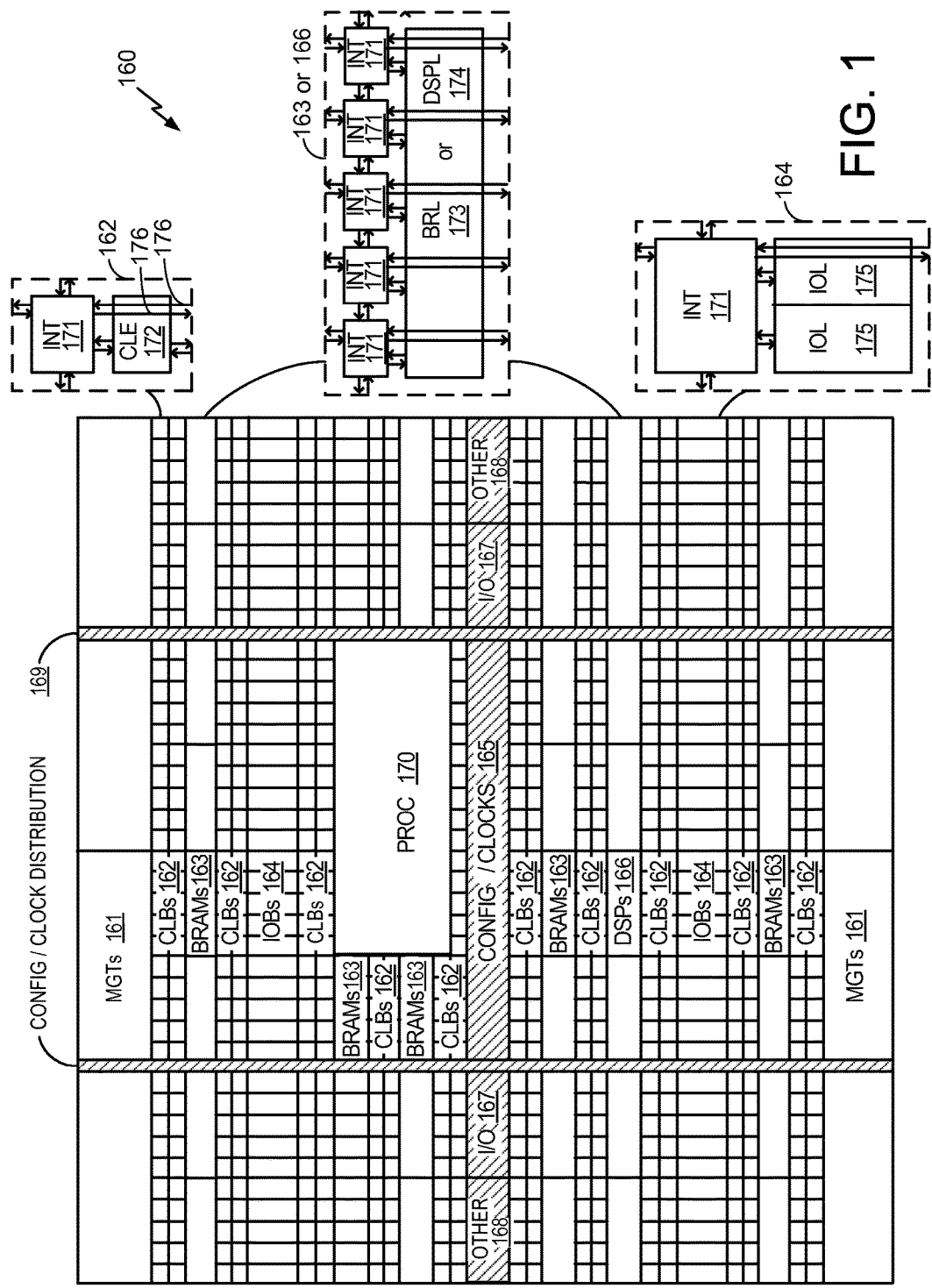
FIG. 1 illustrates an integrated circuit, according to an example.

Various features are described hereinafter with reference to the figures. It should be noted that the figures may or may not be drawn to scale and that the elements of similar structures or functions are represented by like reference numerals throughout the figures. It should be noted that the figures are only intended to facilitate the description of the features. They are not intended as an exhaustive description of the claimed invention or as a limitation on the scope of the claimed invention. In addition, an illustrated example need not have all the aspects or advantages shown. An aspect or an advantage described in conjunction with a particular example is not necessarily limited to that example and can be practiced in any other examples even if not so illustrated, or if not so explicitly described.

Disclosed herein are techniques for adaptively scaling power supply voltage of a programmable integrated circuit. Compact speed-testing ring oscillators are constructed and inserted into a pre-constructed circuit model to test the speed of speed-critical aspects of the interconnect fabric of the programmable integrated circuit. The speed-testing ring oscillators may be made compact by including only two elements configured from lookup table elements ("LUTs") of the programmable integrated circuit. This is in comparison with prior art designs that use many more LUTs and thus generally occupy a much larger area of the programmable integrated circuit. The speed-testing ring oscillators are connected to a power management unit which receives speed values output from the speed-testing ring oscillators and adjusts the power supply voltage to maintain the speed-testing ring oscillators operating at or above a prescribed speed. If all speed-testing ring oscillators are operating too fast, then power management unit reduces voltage to reduce the total power consumed by the programmable integrated circuit while still maintaining operation above a desired speed.

FIG. 1 illustrates an integrated circuit 160 (also referred to as a "programmable integrated circuit"), according to an example. Integrated circuit ("IC") 160 includes a large number of different programmable tiles including multi-gigabit transceivers ("MGTs") 161, configurable logic blocks ("CLBs") 162, random access memory blocks ("BRAMs") 163, input/output blocks ("IOBs") 164, configuration and clocking logic ("CONFIG/CLOCKS") 165, digital signal processing blocks ("DSPs") 166, specialized input/output blocks ("I/O") 167 (e.g., configuration ports and clock ports), and other programmable logic 168 such as digital clock managers, analog-to-digital converters, system monitoring logic, and so forth. The IC 160 may be a field programmable gate array ("FPGA") architecture. IC 160 also includes a dedicated processor, also referred to as a "processing system" or "PROC" 170.

Optionally, each programmable tile includes a programmable interconnect element ("INT") 171 (also referred to herein as a "programmable interconnect point" or "PIP") having standardized connections to and from corresponding interconnect elements in other tiles. The programmable interconnect elements 171 also include the connections to and from the programmable logic element within the same tile, as shown by the examples included at the top of FIG. 1. Thus the programmable interconnect elements 171 allow for connection between elements of different tiles. The programmable interconnect elements taken together implement the programmable interconnect structure (also referred to as the "programmable interconnect fabric") for the illustrated IC 160.

In one example, a CLB 162 can include a configurable logic element ("CLE") 172 that can be programmed to implement user logic plus a single programmable interconnect element ("INT") 171. A BRAM 163 can include a BRAM logic element ("BRL") 173 in addition to one or more programmable interconnect elements 171. Typically, the number of programmable interconnect elements 171 included in a tile depends on the height of the tile. In the pictured IC 160, a BRAM tile 163 has the same height as five CLBs 162, but other numbers (e.g., four) can also be used. A DSP tile 166 can include a DSP logic element ("DSPL") 174 in addition to an appropriate number of programmable interconnect elements 171. An IOB 164 can include, for example, two instances of an input/output logic element ("IOL") 175 in addition to one instance of the programmable interconnect element 171. The programmable interconnect elements 171 are selectively coupled to interconnects 176, which are conductors that traverse one or more tiles. As will be clear to those of skill in the art, the actual I/O pads connected, for example, to the I/O logic element 175 typically are not confined to the area of the input/output logic element 175.

In the pictured IC 160, a horizontal area near the center of the die is used for configuration, clock, I/O 167, and other control logic. Vertical columns 169 extending from this horizontal area or column are used to distribute the clocks and configuration signals across the breadth of the IC 160. Optionally, IC 160 includes additional logic blocks that disrupt the regular columnar structure making up a large part of the IC. The additional logic blocks can be programmable blocks and/or dedicated logic. For example, processor block 170 spans several columns of CLBs and BRAMs.

PROC 170 can be implemented as a hard-wired processor that is fabricated as part of the die that implements the programmable circuitry of the IC 160 and does not include the programmable tiles included within the PL domain. PROC 170 can represent any of a variety of different processor types and/or systems ranging in complexity from an individual processor, e.g., a single core capable of executing program code, to an entire processor system having one or more cores, modules, co-processors, interfaces, or the like.

In a more complex arrangement, for example, PROC 170 can include one or more cores, e.g., central processing units, cache memories, a memory controller, unidirectional and/or bidirectional interfaces configurable to couple directly to I/O pins, e.g., I/O pads, of the IC 160 and/or couple to the programmable circuitry of the IC 160. The phrase "programmable circuitry" can refer to programmable circuit elements within an IC, e.g., the various programmable or configurable circuit blocks or tiles described herein, as well as the interconnect circuitry that selectively couples the various circuit blocks, tiles, and/or elements according to configuration data that is loaded into the IC 160. For example, portions shown in FIG. 1 that are external to PROC 170 can be considered part of the, or the, programmable circuitry of the IC 160.

Note that FIG. 1 is intended to illustrate only an exemplary IC 160 architecture. For example, the numbers of logic blocks in a row, the relative width of the rows, the number and order of rows, the types of logic blocks included in the rows, the relative sizes of the logic blocks, and the interconnect/logic implementations included at the top of FIG. 1 are purely exemplary. For example, in an actual IC 160 more than one adjacent row of CLBs 162 is typically included wherever the CLBs 162 appear, to facilitate the efficient implementation of user logic, but the number of adjacent CLB 162 rows varies with the overall size of the IC 160.

A power supply (not shown in FIG. 1) provides power to the programmable integrated circuit 160. The difference in voltage between the high and low power supply voltages that powers the integrated circuit 160 affects both the speed at which the programmable integrated circuit 160 can run as well as the power consumed. (The difference between high and low power supply voltages may be referred to herein simply as the "power supply voltage"). More specifically, with a higher voltage differential, IC 160 consumes more power but also runs faster. Thus there is a trade-off between power consumption and speed. In general, to minimize power consumption, it is advantageous to operate IC 160 with a power supply voltage that is as low as possible while also allowing the IC 160 to operate at a desired speed.

An approximate value for a power supply voltage for a particular IC 160 may be obtained by simulating a model of the circuit design that is programmed into the IC 160. However, due to variations in physical integrated circuits 160 that are configured with the same circuit design, two different ICs 160 may require different power supply voltages to operate at the same speed. Techniques are thus described herein for "adaptive voltage scaling," which encompasses techniques for automatically adjusting the power supply voltage of a particular physical integrated circuit 160 in order to cause that IC 160 to run at a desired speed while also reducing power consumption.

Figure 2:
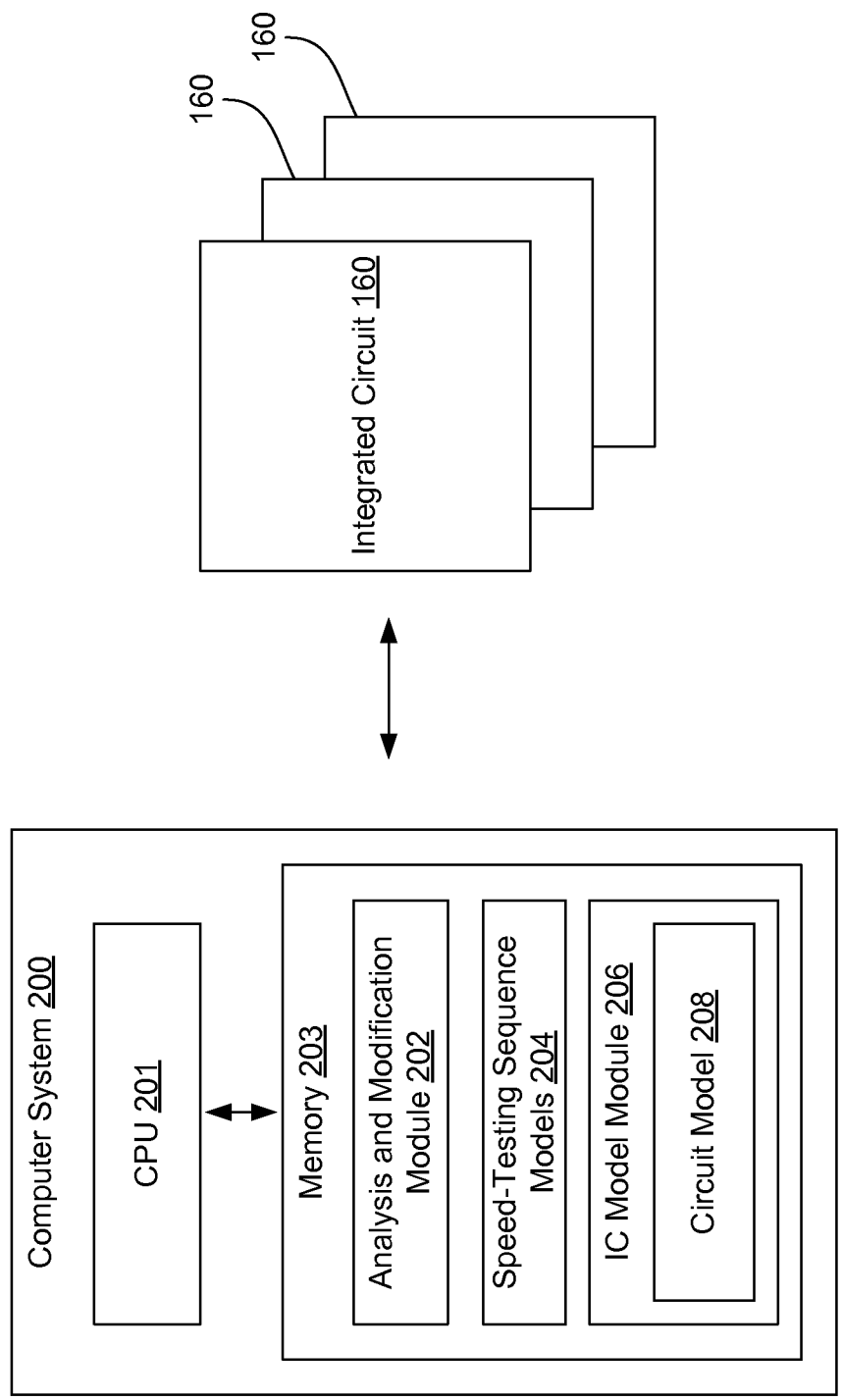
FIG. 2 is an illustration of a computer system for configuring one or more integrated circuits with circuitry for adaptive voltage scaling, according to an example.

FIG. 2 is an illustration of a computer system 200 for configuring one or more ICs 160 with circuitry for adaptive voltage scaling, according to an example. As shown, the computer system 200 includes a central processing unit ("CPU") 201 coupled to a memory 203. The CPU 201 executes instructions stored in the memory 203. The memory 203 stores data and instructions for execution by CPU 201. The computer system 200 is in communication with one or more programmable integrated circuits 160. Computer system 200 may include additional computer components such as bridges, non-volatile storage, input/output devices, and the like.

Although shown as a computer with CPU 201 and memory 203, in various alternative embodiments, the computer system 200 may be any device capable of performing the operations described herein. In one example, computer system 200 may be an application specific integrated circuit ("ASIC"). Computer system 200 may be implemented in various other technically feasible manners.

Memory 203 stores analysis and modification module 202 as well as IC model module 206 that includes a circuit model 208. Computer system 200 also stores speed-testing sequence models 204. In operation, analysis and modification module 202 examines and modifies circuit model 208, which specifies a circuit design for configuration into integrated circuit 160. The circuit model 208 may be a pre-designed model that, when configured into programmable integrated circuit 160, causes programmable integrated circuit 160 to perform desired functionality. As is generally known, programmable integrated circuits 160 have massive flexibility in terms of being configurable to "act as" any desired type of circuit.

Analysis and modification module 202 identifies "free space" within the circuit model 208 (i.e., the circuit that has already been pre-designed) into which one or more speed-testing ring oscillators (discussed below with respect to FIG. 3, also referred to herein as "speed-binning rings") may be added. In operation, the speed-testing ring oscillators emit a signal having a frequency that is characteristic the speed of the IC 160.

Briefly, free space associated with the circuit model 208 includes resources that exist in the programmable IC 160 that are not allocated for use by the elements specified in the circuit model 208. For example, free space may include an unused tile, such as a CLB 162, or unused elements of a tile, such as lookup-table elements of a CLB 162, that exists in IC 160, but that are not specified as being allocated for usage by the elements of circuit model 208. Analysis and modification module 202 identifies free space in chunks that are large enough to accommodate the speed-testing ring oscillators discussed in further detail with respect to FIG. 3. More specifically, analysis and modification module 202 identifies free space that encompasses each of the individual elements of the speed-testing ring oscillators.

Once analysis and modification module 202 identifies the free space for the speed-testing ring oscillators, analysis and modification module 202 adds the speed-testing ring oscillators to the circuit model 208, connecting the speed-testing ring oscillators to a power management unit (not shown in FIG. 2) that controls power supply voltages of IC 160 and that is described below with respect to FIGS. 3 and 4. Once analysis and modification module adds the speed-testing ring oscillators to the circuit model 208, IC model module 206 configures the integrated circuit 160 to implement the circuit design specified by the circuit model 208, which includes both the circuit model as it existed before analysis and modification module 202 added the speed-testing ring oscillators, as well as the speed-testing ring oscillators themselves.

After computer system 200 configures an integrated circuit 160 with the circuit model 208, the integrated circuit 160 may operate as specified by the circuit model 208. In operation, the speed-testing ring oscillators configured into integrated circuit 160 output signals having a frequency that is indicative of the speed of IC 160. More specifically, the speed-testing ring oscillators include speed-testing sequences for testing the speed of integrated circuit 160, as well as other components. The speed-testing sequences, discussed in greater detail below with respect to FIG. 3, are pre-chosen sequences selected to be characteristic of the timing-critical aspects of integrated circuit 160. The measured speed-performance of these sequences are deemed to be sufficiently indicative of the speed-performance of the integrated circuit 160 as a whole. Note that these pre-chosen sequences may be designed and/or chosen by computer or human analysis.

While IC 160 is operating, the power management unit receives frequency signals from the speed-testing ring oscillators and adjusts the power supply voltage for the IC 160 based on the frequency signals. These operations are discussed in greater detail below with respect to FIG. 4.

Note that each of a plurality of different ICs 160 may be configured with the same circuit model 208, including the same speed-testing ring oscillators. Due to physical differences in the different ICs 160, the same speed-testing ring oscillator in two different ICs 160 may output different speed output values. The power management unit would adjust the voltage for the different ICs 160 to different values, based on these different speed output values.

Figure 3:
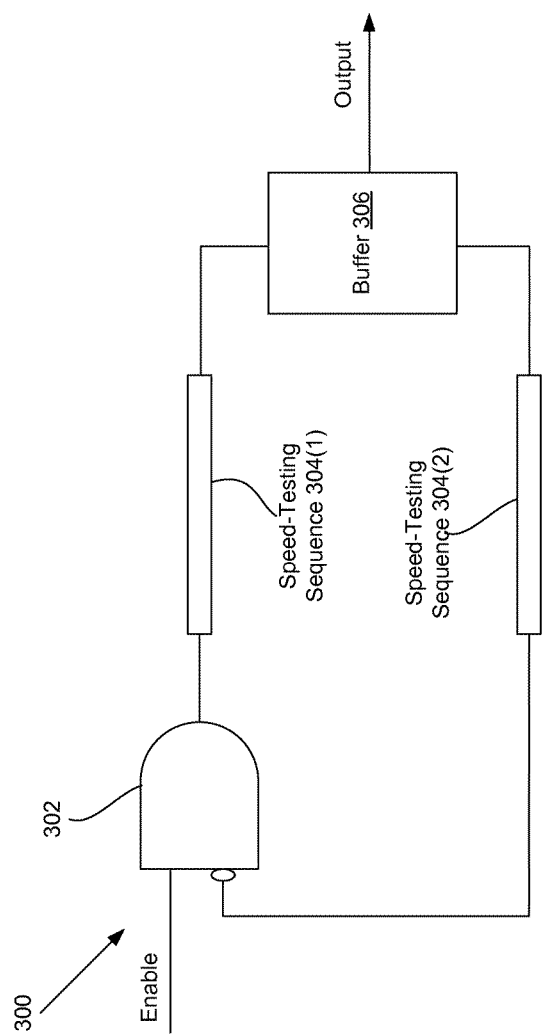
FIG. 3 shows a speed-testing ring oscillator for configuration into a programmable integrated circuit, according to an example.

FIG. 3 shows a speed-testing ring oscillator 300 for configuration into a programmable integrated circuit 160, according to an example. As shown, the speed-testing ring oscillator 300 includes an AND gate 302 with an inverting input, a first speed-testing sequence 304(1), a buffer 306, and a second speed-testing sequence 304(2). The AND gate 302 may be an "AND2i" gate. The AND gate 302, first speed-testing sequence 304(1), buffer 306, and second speed-testing sequence 304(2) are coupled in a ring formation. More specifically, the output of the AND gate 302 is coupled to the first speed-testing sequence 304(1), whose output is coupled to the buffer 306, whose output is coupled to the second speed-testing sequence 304(2), whose output is coupled to the inverting input of the AND gate 302. An enable signal is coupled to the non-inverting input of the AND gate 302. When the enable signal is asserted, the output of the AND gate 302 is the reverse of the signal at the inverting input. This output signal propagates around the speed-testing ring oscillator 300, flowing through the speed-testing sequences 304 and the buffer 306 and flowing back to the AND gate 302. The delay around the speed-testing ring oscillator 300 is equal to the delay through each of its elements. This delay is indicative of the speed of the speed-testing sequences 304. Because the composition of the speed-testing sequences is chosen to be characteristic of speed-related aspects of IC 160, the delay of the speed-testing sequences 304 is also indicative of the speed of IC 160 as a whole.

More specifically, each speed-testing sequence 304 includes at least one programmable interconnect point 171 ("PIP") and at least one interconnect 176. Each speed-testing sequence 304 may include more than one programmable interconnect point 171 and more than one interconnect 176. Speed-testing sequence 304(1) and speed-testing sequence 304(2) may be identical. Because the speed of the interconnect fabric (which includes the PIPs 171 and interconnects 176) of IC 160 is an important component of the overall speed of IC 160, measuring the speed of the speed-testing sequences 304 characterizes the speed of IC 160 well.

Both AND gate 302 and buffer 306 are implemented within a CLB 162 of IC 160. Buffer 306 constitutes one or more logic gates coupled together so that the output of the buffer 306 is the same as the input of the buffer 306. In one example, an even number (such as 2 or 4) of inverters are used. In another example, an AND gate or OR gate with inputs tied together is used. Those of skill in the art will recognize that other combinations of logic gates may be used as well.

Note that although the AND gate 302 and buffer 306 are implemented within CLBs 162 (more specifically, within lookup table elements or "LUTs," which are function generators within CLEs 172 of CLBs 162), the speed-testing sequences 304 include no elements that are implemented in CLBs 162 (other than possibly the interconnect portion of CLBs 162). Instead, the speed-testing sequences 304 include elements are part of the interconnect fabric, as described above.

In some examples, a speed-testing sequence 304 includes one or more pairs of interconnect types coupled in series. An interconnect type refers to the "length" of the interconnect, which is the number of tiles that the interconnect 176 crosses. In one example, interconnects 176 may have the following types: SINGLE, DOUBLE, QUAD, PENT, HEX, and LONG, which cross one, two, four, five, six, and sixteen tiles, respectively. A pair of interconnect types includes a combination such as SINGLE-SINGLE, DOUBLE-DOUBLE, QUAD-PENT, HEX-DOUBLE, and so on. Each such combination includes a pair of interconnects 176 (and connecting PIPs 171) coupled in series. Each speed-testing sequence 304 may include one or more different pairs of interconnect types.

Because pairs of interconnect types are present throughout the interconnect fabric (i.e., not just in the speed-testing ring oscillators 300), testing the speed of the pairs of interconnect types serves to test the speed of the interconnect fabric as a whole. Testing pairs of interconnect types in specifically constructed speed-testing ring oscillators 300 is effective in testing the speed related to other pairs having the same interconnect types through IC 160 because interconnect types throughout the IC 160 have similar speed characteristics. Different speed-testing ring oscillators 300 with different speed-testing sequences 304 are constructed in IC 160 to test the speed of different interconnect types of the IC 160.

Among other advantages, the speed-testing ring oscillator 300 illustrated in FIG. 3 is compact as compared with older circuits used for speed testing. One distinction is that the speed-testing ring oscillator 300 may be configured with only two lookup table elements ("LUTs" or "LUT elements"), as compared with older circuits that include many LUTs. LUTs are configurable logic elements within CLBs 162 and each CLB 162 may include more than one LUT. LUTs are capable of implementing multiple different multiple-input logical operations, such as logical AND, OR, XOR operations, and other operations.

The fact that speed-testing ring oscillator 300 may be built from only two LUTs means that the speed-testing ring oscillator 300 is compact and may fit into parts of IC 160 more easily than older speed-testing circuits which include elements associated with many more LUTs. The reduced number of LUTs and general compactness of speed-testing ring oscillator 300 allows a circuit designer to first design a functional circuit for configuration into IC 160 and subsequently to submit that functional circuit to computer system 200 for addition of speed-testing ring oscillators 300. Computer system 200 would then find unoccupied ("free") space within IC the circuit model 208 for addition of speed-testing ring oscillators 300 by identifying PIPs 171 and interconnects 176 that are not in use for use as the speed-testing sequences 304 and finding CLBs 162 coupled to those PIPs 171 and interconnects 176 into which the AND gate 302 and buffer 306 are to be configured. Computer system 200 would automatically add these identified circuit components to the circuit model 208 for configuration into IC 160. This technique is in contrast with techniques for previous speed-testing circuits, which required reserving areas of IC 160 specifically designated for the speed-testing circuits and were more disruptive of the design process of the main circuit design for configuration into IC 160.

Another advantage of the compact design of speed-testing ring oscillator 300 is that speed-testing ring oscillators 300 may be placed in different locations across IC 160, which allows for measurement of differences in performance at different locations in IC 160. In the past, speed testing circuits were generally confined to a single area of an integrated circuit, reserved for that purpose, which prevented obtaining knowledge of performance at different locations on the integrated circuit. However, with the compact design of speed-testing ring oscillator 300, multiple speed-testing ring oscillators 300 may be placed in different areas of IC 160 so that differences in speed at different locations in IC 160 can be measured.

Figure 4:
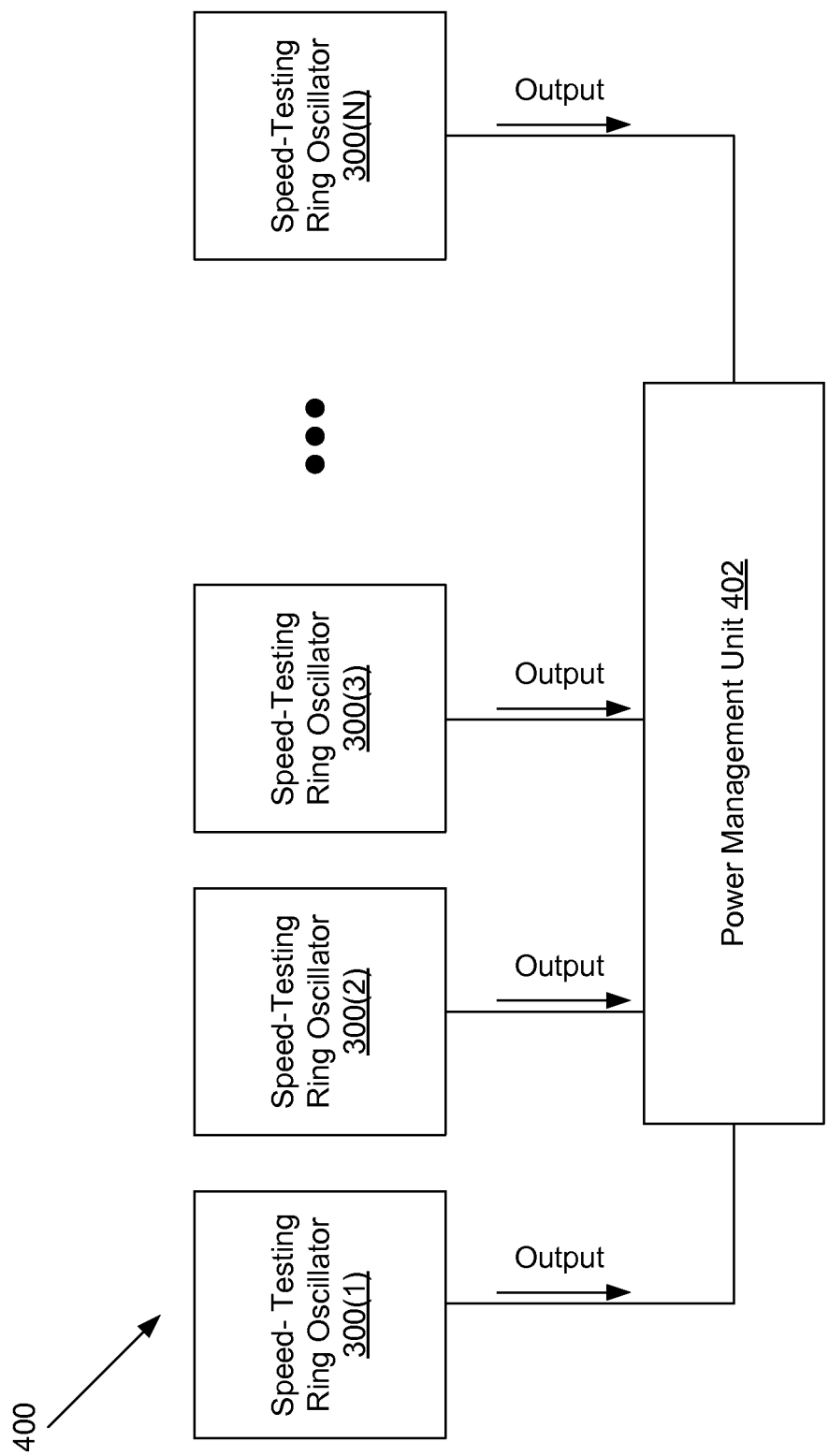
FIG. 4 is an illustration of an adaptive voltage scaling system, according to an example.

FIG. 4 is an illustration of an adaptive voltage scaling system 400 ("AVS system"), according to an example. As shown, the AVS system 400 includes multiple speed testing ring oscillators 300, all coupled to a power management unit 402. The power management unit 402 stores or has access to data that indicates the speed at which each speed-testing ring oscillator 300 should run. The exact composition of each speed-testing ring oscillator 300, including the composition of the speed-testing sequences 304, such as which PIPs 171 and which interconnects 176 the speed-testing sequences 304 include, is provided to the computer system 200 already pre-determined. In one example, these compositions are determined by human designers with appropriate expertise and knowledge of the specific integrated circuit 160 for which the testing is being performed.

In operation within an integrated circuit 160, power management unit 402 adaptively adjusts the power supply voltage based on speed measurements received from the speed-testing ring oscillators 300. More specifically, if all speed-testing ring oscillators 300 are running over a threshold amount (e.g., 1% or 5%) higher than respective pre-scribed speed values, then power management unit 402 lowers the power supply voltage until one of the speed-testing ring oscillators 300 is operating at or within a threshold amount above its prescribed speed value. If one or more speed-testing ring oscillators 300 are running slower than respective prescribed speed values, then power management unit 402 raises the power supply voltage until all speed-testing ring oscillators 300 are running at or faster than respective prescribed speed values. If all speed-testing ring oscillators 300 are running over their respective prescribed speed values and at least one is operating within the threshold amount of its respective speed value, then power management unit 402 makes no adjustments.

When computer system 200 (FIG. 2) is configuring IC 160 with the circuit model 208, the prescribed speed values may be stored, along with the speed-testing sequences, in speed-testing sequence models 204, within memory 203 of computer system 200. When IC model module 206 configures IC 160 with circuit model 208, IC model module 206 also configures the power management unit 402 with the prescribed speed values.

Note that in addition to compensating for variations across different physical devices, the power management unit 402 also compensates for temperature-induced variations. More specifically, because power management unit 402 adjusts voltage based on speed, speed changes related to temperature changes will be adjusted for as well.

Figure 5:
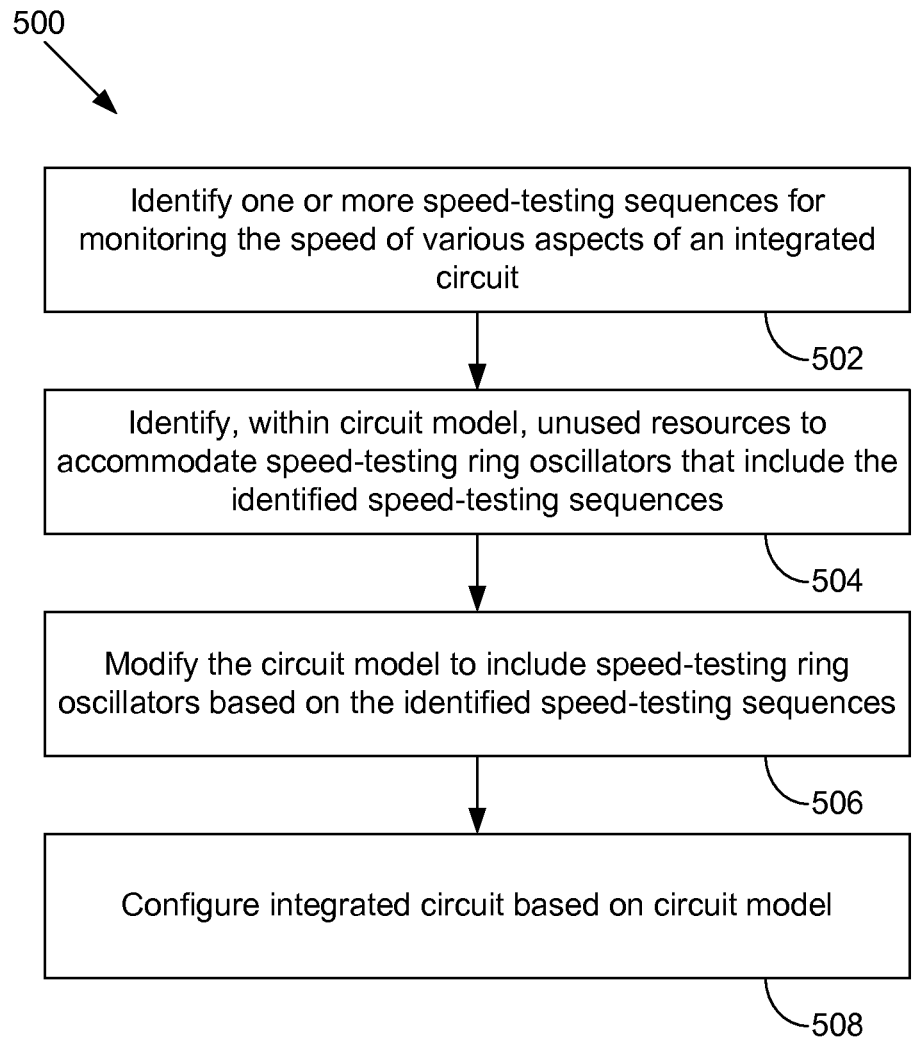
FIG. 5 is a flow diagram of a method for configuring an integrated circuit with speed-testing ring oscillators for adaptive voltage scaling, according to an example.

FIG. 5 is a flow diagram of a method 500 for configuring IC 160 with speed-testing ring oscillators for adaptive voltage scaling, according to an example. Although described in conjunction with the system of FIGS. 1-4, those of skill in the art will realize that any entity that performs the operations, in any technically feasible order, would be within the scope of the present disclosure.

As shown, a method 500 begins at operation 502, where computer system 200 identifies one or more speed-testing sequences 304 for monitoring the speed of various aspects of an integrated circuit 160. The speed-testing sequences 304 include one or more PIPs 171 and one or more interconnects 176 illustrated in FIG. 1, but do not include logical elements such as logic gates that would be included within a lookup table element ("LUT element" or "LUT") of a CLB 162. The speed-testing sequences 304 may be pre-selected or predesigned to be sufficiently characteristic of various aspects of speed of the circuit design associated with circuit model 208.

At operation 504, analysis and modification module 202 identifies free resources within circuit model 208, the free resources including the identified speed-testing sequences 304, as well as a LUT element that can implement an AND gate 302 and a LUT element that can implement buffer 306. Analysis and modification module 202 identifies these free resources in areas and configurations that can accommodate a speed-testing ring oscillator 300 as shown in FIG. 3.

At operation 506, once analysis and modification module 202 identifies the resources for the speed-testing ring oscillators 300, analysis and modification module 202 modifies the circuit model 208 to include speed-testing ring oscillators 300 with the identified speed-testing sequences. Analysis and modification module 202 also modifies the circuit model 208 to couple the speed-testing ring oscillators 300 to a power management unit 402 as described with respect to FIG. 4. At operation 508, IC model module 206 configures integrated circuit 160 with the now-modified circuit model 208 that includes the speed-testing ring oscillators 300 coupled to a power management unit.

Figure 6:
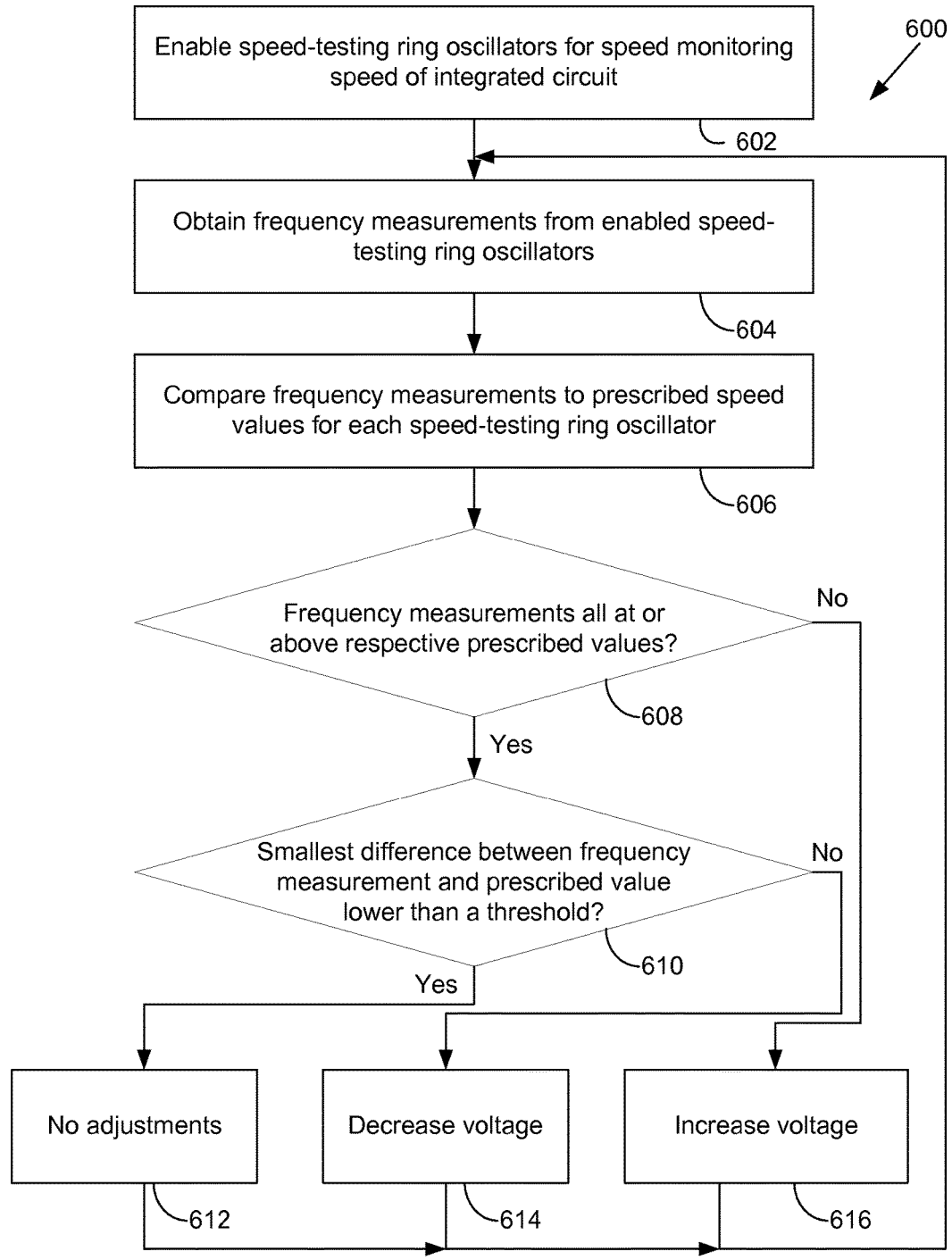
FIG. 6 is a flow diagram of a method for adaptively scaling voltage of an integrated circuit, according to an example.

FIG. 6 is a flow diagram of a method 600 for adaptively scaling voltage of IC 160, according to an example. Although described in conjunction with the system of FIGS. 1-4, those of skill in the art will realize that any entity that performs the operations, in any technically feasible order, would be within the scope of the present disclosure.

As shown, a method 600 begins at operation 602, where power management unit 402 enables speed-testing ring oscillators 300 for measuring speed of integrated circuit 160. When enabled, the speed-testing ring oscillators 300 generate a digital signal with a frequency that is characteristic of the speed with which the speed-testing sequences 304 are able to run. Different speed-testing ring oscillators 300 may run at different speeds. At operation 604, power management unit 402 obtains frequency measurements from the different speed-testing ring oscillators 300. The frequency measurements may be obtained by identifying the number of times that the speed-testing ring oscillators 300 oscillate in a fixed period of time.

At operation 606, power management unit 402 compares the obtained frequency measurements to prescribed frequencies for each of the speed-testing ring oscillators 300. As with the speed-testing sequences 304, the prescribed frequencies are predefined. At operation 608, if the frequency measurements for all speed-testing ring oscillators 300 are at or above their respective prescribed values, then the method 600 proceeds to operation 610. If the frequency measurement for at least one speed-testing ring oscillator 300 is below a corresponding prescribed value, then the method 600 proceeds to operation 616. At operation 610, if the smallest difference between frequency measurements and respective prescribed values is lower than a threshold, then the method proceeds to operation 612. If the smallest difference between frequency measurements and respective prescribed values is not lower than a threshold, then the method proceeds to operation 614.

Note that at operation 610, if the smallest difference between frequency measurements and respective prescribed values is lower than a threshold, then that smallest difference is also "positive"—meaning that that frequency measurement is above the respective prescribed values. This is because operation 610 happens when the result of operation 608 is "yes." Thus, at operation 612, no further adjustments are made. Similarly, if the smallest difference is not below a prescribed value, then all frequency measurements are significantly above respective prescribed values. In this situation, at operation 614, power management unit 402 decreases the voltage.

At operation 616, the power management unit 402 increases the voltage. This is because at least one of the frequency measurements is below the prescribed value, meaning that the circuit should be run faster. Thus, voltage is increased.

After operations 612, 614, or 616, the method 600 returns to operation 604, when power management unit 402 again obtains frequency measurements from enabled speed-testing ring oscillators 300.

In this disclosure, various modules with specific subdivisions of functionality are shown. However, it should be understood that any combination of modules performing any technically feasible subdivision of functionality could be used.

Note that although various specific logic gates are described herein, those of skill in the art will recognize that other logic gates may or electrical components that perform analogous functions may instead be substituted.

Although signals are sometimes described herein as having a particular logical value—i.e., high or low (or "0" or "1" or some equivalent), those of skill in the art will recognize that for any particular signal, polarities may be reversed. For example, a signal that, when brought high, has a particular effect, may alternatively have that particular effect when brought low.

The various examples described herein may employ various computer-implemented operations involving data stored in computer systems. For example, these operations may require physical manipulation of physical quantities—usually, though not necessarily, these quantities may take the form of electrical or magnetic signals, where they or representations of them are capable of being stored, transferred, combined, compared, or otherwise manipulated. Further, such manipulations are often referred to in terms, such as producing, identifying, determining, or comparing. Any operations described herein that form part of one or more example implementations may be useful machine operations. In addition, one or more examples also relate to a device or an apparatus for performing these operations. The apparatus may be specially constructed for specific required purposes, or it may be a general purpose computer selectively activated or configured by a computer program stored in the computer. In particular, various general purpose machines may be used with computer programs written in accordance with the teachings herein, or it may be more convenient to construct a more specialized apparatus to perform the required operations.

The various examples described herein may be practiced with other computer system configurations including handheld devices, microprocessor systems, microprocessor-based or programmable consumer electronics, minicomputers, mainframe computers, and the like.

One or more examples may be implemented as one or more computer programs or as one or more computer program modules embodied in one or more computer readable media. The term computer readable medium refers to any data storage device that can store data which can thereafter be input to a computer system—computer readable media may be based on any existing or subsequently developed technology for embodying computer programs in a manner that enables them to be read by a computer. Examples of a computer readable medium include a hard drive, network attached storage (NAS), read-only memory, random-access memory (e.g., a flash memory device), a Compact Disc (CD)-ROM, a CD-R, or a CD-RW, a DVD (Digital Versatile Disc), a magnetic tape, and other optical and non-optical data storage devices. The computer readable medium can also be distributed over a network coupled computer system so that the computer readable code is stored and executed in a distributed fashion.

While the foregoing is directed to specific example implementations, other and further example implementations may be devised without departing from the basic scope thereof, and the scope thereof is determined by the claims that follow.

What is claimed is:

1. A speed-testing ring oscillator for testing speed of a programmable integrated circuit, the speed-testing ring oscillator comprising:
   an AND gate configured from a first configurable logic element of the programmable integrated circuit;
   a first speed-testing sequence coupled to an output of the AND gate;
   a buffer coupled to an output of the first speed-testing sequence; and
   a second speed-testing sequence distinct from the first speed-testing sequence and coupled to an output of the buffer and to an inverting input of the AND gate, wherein the first speed-testing sequence includes a first programmable interconnect point and a first interconnect and the second speed-testing sequence includes a second programmable interconnect point and a second interconnect.

2. The speed-testing ring oscillator of claim 1, wherein the buffer comprises:
   one or more logic gates configured from a second configurable logic element and operable to output a logical value identical to an input.

3. The speed-testing ring oscillator of claim 1, wherein the first programmable interconnect point is of the same type as the second programmable interconnect point and the first interconnect is of the same type as the second interconnect.

4. The speed-testing ring oscillator of claim 1, wherein:
   both the first speed-testing sequence and the second speed-testing sequence are free from elements configured from lookup table elements; and
   the AND gate is configured from a lookup table element of a configurable logic element.

5. The speed-testing ring oscillator of claim 1, wherein:
   in response to an enable signal of the AND gate being asserted, the buffer is operable to output an oscillating signal indicative of speed characteristics of the first speed-testing sequence and the second speed-testing sequence.

6. The speed-testing ring oscillator of claim 1, wherein:
   the speed-testing ring oscillator is configured into free space of circuit elements within an already-designed circuit model.

7. A programmable integrated circuit, comprising:
   a first speed-testing ring oscillator including:
     an AND gate configured from a first configurable logic element of the programmable integrated circuit;
     a first speed-testing sequence coupled to an output of the AND gate;
     a buffer coupled to an output of the first speed-testing sequence; and
     a second speed-testing sequence distinct from the first speed-testing sequence and coupled to an output of the buffer and to an inverting input of the AND gate, wherein the first speed-testing sequence includes a first programmable interconnect point and a first interconnect and the second speed-testing sequence includes a second programmable interconnect point and a second interconnect; and
   a power management unit coupled to the first speed-testing ring oscillator, the power management unit operable to adjust a power supply voltage for the programmable integrated circuit based on an output of the first speed-testing ring oscillator.

8. The programmable integrated circuit of claim 7, further comprising:
   a second speed-testing ring oscillator,
   wherein the power management unit is operable to adjust the power supply voltage to bring both a first output from the first speed-testing ring oscillator equal to or above a first prescribed speed value and a second output from the second speed-testing ring oscillator equal to or above a second prescribed speed value.

9. The programmable integrated circuit of claim 8, wherein:
   the first speed-testing ring oscillator and the second speed-testing ring oscillator are disposed at different locations on the programmable integrated circuit in order to capture cross-die variability.

10. The programmable integrated circuit of claim 7, further comprising:
a plurality of speed-testing ring oscillators that includes the first speed-testing ring oscillator,
wherein the power management unit is operable to adjust the power supply voltage by:
comparing outputs from each speed-testing ring oscillator to respective prescribed speed values,
if each output is more than a threshold amount above the respective prescribed speed values, then lowering the power supply voltage,
if each output is greater than the respective prescribed speed values and at least one output is within the threshold amount above the respective prescribed speed value, then not modifying the power supply voltage, and
if at least one output is lower than the prescribed speed value, then raising the power supply voltage.

11. The programmable integrated circuit of claim 7, wherein the buffer comprises:
one or more logic gates configured from a second configurable logic element and operable to output a logical value identical to an input.

12. The programmable integrated circuit of claim 7, wherein the first programmable interconnect point is of the same type as the second programmable interconnect point and the first interconnect is of the same type as the second interconnect.

13. The programmable integrated circuit of claim 7, wherein:
both the first speed-testing sequence and the second speed-testing sequence are free from elements configured from lookup table elements; and
the AND gate is configured from a lookup table element of a configurable logic element.

14. The programmable integrated circuit of claim 7, wherein:
in response to an enable signal of the AND gate being asserted, the buffer is operable to output an oscillating signal indicative of speed characteristics of the first speed-testing sequence and the second speed-testing sequence.

15. The programmable integrated circuit of claim 7, further comprising:
circuit model elements configured into the programmable integrated circuit based on a circuit model,
wherein the first speed-testing ring oscillator is configured into free space of the circuit model.

16. The method of claim 15, further comprising:
adding a second speed-testing ring oscillator to the free space of the circuit model at a different location than for the speed-testing ring oscillator in order to capture cross-die variability.

17. A method for configuring a programmable integrated circuit for adaptive voltage scaling, the method comprising:
obtaining a circuit model for analysis;
identifying free space within the circuit model for a speed-testing ring oscillator;
adding the speed-testing ring oscillator to the free space of the circuit model; and
configuring the programmable integrated circuit with the speed-testing ring oscillator,
wherein the speed-testing ring oscillator comprises:
an AND gate configured from a first configurable logic element of the programmable integrated circuit;
a first speed-testing sequence coupled to an output of the AND gate;
a buffer coupled to an output of the first speed-testing sequence; and
a second speed-testing sequence distinct from the first speed-testing sequence and coupled to an output of the buffer and to an inverting input of the AND gate, wherein the first speed-testing sequence includes a first programmable interconnect point and a first interconnect and the second speed-testing sequence includes a second programmable interconnect point and a second interconnect.

18. The method of claim 17, wherein the buffer comprises:
one or more logic gates configured from a second configurable logic element and operable to output a logical value identical to an input.

19. The method of claim 17, wherein:
the first programmable interconnect point is of the same type as the second programmable interconnect point and the first interconnect is of the same type as the second interconnect; and
both the first speed-testing sequence and the second speed-testing sequence are free from elements configured from lookup table elements.

20. The method of claim 17, wherein:
the AND gate is configured from a lookup table element of a configurable logic element; and
in response to an enable signal of the AND gate being asserted, the buffer is operable to output an oscillating signal indicative of speed characteristics of the first speed-testing sequence and the second speed-testing sequence.

* * * * *